United States Patent [19]

Burg

[11] 4,343,888

[45] Aug. 10, 1982

[54] USE OF RADIATION CROSSLINKABLE POLYESTERS AND POLYESTERETHERS IN PRINTING PLATES

[75] Inventor: Marion Burg, Wilmington, Del.

[73] Assignee: E. I. Du Pont de Nemours and Company, Wilmington, Del.

[21] Appl. No.: 226,882

[22] Filed: Jan. 21, 1981

Related U.S. Application Data

[62] Division of Ser. No. 145,755, May 1, 1980, Pat. No. 4,284,710.

[51] Int. Cl.$^3$ .............................................. G03C 5/00
[52] U.S. Cl. .................................. 430/302; 430/275; 430/278
[58] Field of Search ............... 430/285, 286, 271, 275, 430/278, 302; 204/159.19, 159.22; 528/112, 176

[56] References Cited

U.S. PATENT DOCUMENTS

| | | |
|---|---|---|
| 3,594,410 | 7/1971 | Cohen et al. ...................... 430/285 |
| 3,707,373 | 12/1972 | Martinson et al. ................. 430/285 |
| 3,867,318 | 2/1975 | Nishikubo et al. ................. 430/285 |
| 4,284,710 | 8/1981 | Burg ................................. 430/285 |

FOREIGN PATENT DOCUMENTS

| | | |
|---|---|---|
| 849803 | 6/1977 | Belgium . |
| 2507008 | 9/1975 | Fed. Rep. of Germany . |
| 1474715 | 5/1977 | United Kingdom . |
| 1572441 | 7/1980 | United Kingdom . |

*Primary Examiner*—Jack P. Brammer

[57] ABSTRACT

Solvent-soluble polymeric esters and polymeric esterethers with radiation-crosslinkable ethylenic unsaturation in the linear polymeric structure, and recurring pendant hydroxyl groups, are derived from monomers which include diepoxides and monomers with at least one $\alpha,\beta$-unsaturated carboxylic acid group. These polymeric products react with cyclic anhydrides to form aqueous alkaline-soluble polymers which are useful as films for photomechanical processes, including lithographic applications and as photoresists.

4 Claims, No Drawings

USE OF RADIATION CROSSLINKABLE POLYESTERS AND POLYESTERETHERS IN PRINTING PLATES

This is a division of application Ser. No. 145,755, filed May 1, 1980 now U.S. Pat. No. 4,284,710.

BACKGROUND OF THE INVENTION

This invention is directed to photocrosslinkable compositions useful in the photomechanical arts, e.g., in the manufacture of lithographic printing plates, printed circuits, and the like.

It is known to prepare photopolymerizable compositions which contain, inter alia, an organic polymer binding material, an addition-polymerizable ethylenically unsaturated compound, e.g., vinylidene and vinyl monomers, preferably of the acrylic or alkacrylic ester type, and an addition-polymerization initiator which is activatable by actinic radiation. When one of these compositions is formed into a photopolymerizable layer of uniform thickness and adhered to a suitable base support, the resulting structure is called a photopolymerizable element. The photopolymerizable layer is then exposed to actinic radiation through a suitable pattern until substantial addition polymerization takes place in the exposed image areas. The unexposed portions are removed with a solvent, leaving a relief image useful for printing and other applications.

BACKGROUND ART

Photosensitive compositions comprising polymers having pendant cinnamate side chains, e.g., photocrosslinkable polyvinyl cinnamate, are disclosed in "Photoresist: Materials and Process," by W. S. De Forest, McGraw-Hill (175) pages 24–29. Other such polymers having pendant free carboxyl-containing groups are disclosed in U.S. Pat. No. 3,770,443 "Photosensitive Composition Comprising A Photosensitive Polymer" (1973). Other materials useful in this technology are (1) the ethylenically unsaturated polyhydroxy diester polyethers disclosed in U.S. Pat. No. 3,661,576 "Photopolymerizable Compositions and Articles" (1972); (2) linear polyesters of glycols and cinnamic acids which are substituted in the para position with —OH, —COOH, or —CH=CH—COOH groups, as disclosed in British specification Nos. 951,928 and 838,547 and U.S. Pat. No. 3,030,208, and (3) related linearly unsaturated polymers with pendant and linearly substituted aqueous sensitive groups as described in U.S. Pat. No. 3,929,489; U.S. Pat. No. 4,073,777 and British Pat. No. 1,470,059.

The photosensitive compositions disclosed in these references suffer from various disadvantages, including less than optimum mechanical properties in some cases and the need for special, and sometimes high boiling and toxic, coating solvents and developers in others. Another disadvantage is the formation of by-products and the need to remove them during the polymer synthesis. Photopolymerizable acrylic layers usually require protective overcoats or cover sheets to exclude oxygen when exposed to actinic radiation.

The present invention provides a new class of radiation-crosslinkable polymers which avoid these deficiencies.

SUMMARY OF INVENTION

The present invention is based on the discovery of, and the synthesis of, a new class of radiation-sensitive condensation polymers which are useful as photocrosslinkable elements in lithographic and photoresist applications. This new class of condensation polymers is composed of (a) linear, film-forming, polyesters and polyesterethers which are hydroxy-substituted, i.e., have a multiplicity of recurring pendant hydroxyl groups, and also have radiation-crosslinkable

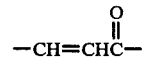

groups predominantly linked through recurring ester bonds as part of the linear polymeric structure, and (b) the dicarboxylic semi-esters (half esters) of the aforesaid polymers, formed by reacting the polymer with a cyclic anhydride to convert some or all of the hydroxyl groups to semi-esters. The hydroxy-containing polymers are derived from the reaction of diepoxide monomers, such as the diglycidyl ethers of dihydroxybenzenes, with polyester or polyester-ether-forming difunctional monomers having at least one —CH=CHCOOH group to provide the

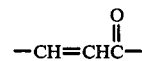

repeating unit. The repeating

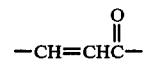

units are preferably formed from cinnamic acid and its derivatives and can be defined by the formula:

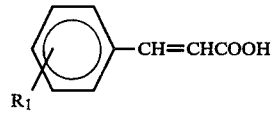

where $R_1$ is —COOH, —CH=CHCOOH, or —OH. Preferably $R_1$ is —CH=CHCOOH as in the case of 1,4-phenylene diacrylic acid. This invention also includes coating compositions of the aforesaid linear polymers and their semi-esters, as well as articles comprising supports coated therewith.

DETAILED DISCLOSURE OF THE INVENTION

In terms of structural formula, the linear repeating unit making up the polymeric backbone structure with pendant hydroxyl groups can be represented by formula I,

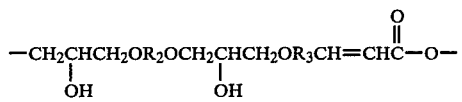

wherein $R_2$ is a divalent hydrocarbon unit, e.g., aryl, alkyl, aralkyl, or cycloalkyl having 2–20 carbon atoms, and wherein $R_2$ may be derived from alicyclic and aliphatic diols up to $C_{18}$, but is preferably aryl and preferably derived from dihydric phenols, dihydric naphthols, bisphenols, dihydroxy-biphenyls, or dihydroxynaphthalenes; and wherein $R_2$ may also be partially or totally substituted with a $C_1$ to $C_{10}$ alkyl or cycloalkyl, aryl, or halogen; and wherein R₃ is a divalent aryl, aroyl, arylacryloyl, furylacryloyl, pyridylacryloyl, or thienylacryloyl group unit, as described by formula II below, wherein the aromatic unit for aryl is phenyl, biphenyl, or naphthyl, and the aromatic unit for aroyl is benzoyl or naphthoyl, and wherein one of the R₃ cyclic carbon atoms is directly attached to the β-carbon of the α,β-ethylenic ester group of the repeating unit; and wherein the aromatic unit of the R₃ group can be unsubstituted or partially or totally substituted with a C₁ to C₈ alkyl or cycloalkyl, aryl, aralkyl, or halogen group.

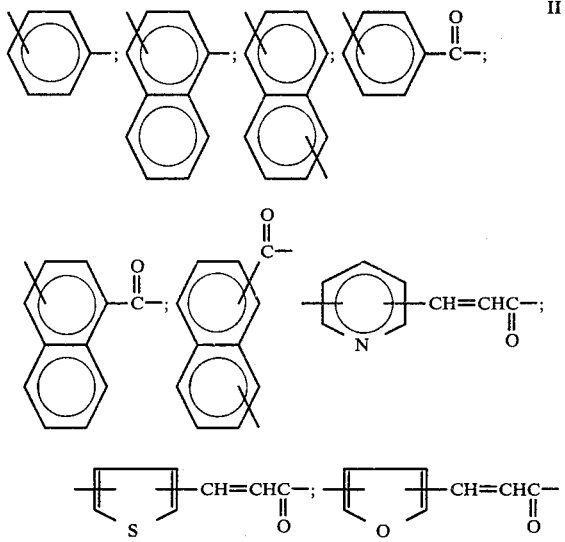

These polyesters and polyesterethers, or the dicarboxylic acid semi-esters thereof prepared by reacting the pendant hydroxyl groups of the hydroxy-substituted polyester or polyesterether with a cyclic anhydride, such as succinic anhydride, can be coated on appropriate film or metal supports, the resulting coating dried and imagewise exposed to actinic radiation, and then developed in either an organic, an aqueous organic, or an aqueous alkaline development solution to selectively remove unexposed areas.

A special advantage of this invention is that it permits adjustment and control of aqueous sensitivity, as well as other polymer properties, independently from the polymerization synthesis step. Thus, photosensitivity need not be diminished by replacing some of the photosensitive monomer by nonphotosensitive solubilizing monomer. This type of replacement can be done if so desired. Another advantage is the ability to provide excellent adhesion directly to a substrate, particularly to metal supports used in lithographic processes.

Still another advantage is the ability to readily and reproducibly make linear polymers which are solvent-soluble (soluble in conventional organic and aqueous-organic solvents), as well as being film-forming, thermally stable, reactive polymers, and to do so without formation of by-products and without undesirable side reactions which can lead to the formation of insoluble gels and to crosslinked, insoluble solids. The attainment of this advantage is most unexpected in view of the state of the art. It is well known in the art that dicarboxylic acids and phenols are among the acid curing agents for diepoxides, and that they can participate in the reaction to become part of the polymer structure; this is described in Chapters 5 and 11 of the "Handbook of Epoxy Resins," H. Lee and K. Neville, McGraw-Hill (1967). More specifically, these authors point out that curing of liquid or thermoplastic epoxides generally converts them to insoluble gels or infusible and insoluble, crosslinked thermoset solids. Several kinds of acid curing reactions can occur which lead to crosslinking: (1) a hydroxyl group formed from the epoxide can react with epoxy and carboxylic acid groups to bring about crosslinking as described by Lee and Neville and in U.S. Pat. No. 2,962,469; (2) etherification between the different epoxy chains can lead to insoluble crosslinked chains. By either mechanism, the resultant infusible, insoluble cured products are totally unwanted for our purposes.

In accordance with the present invention, the use of a basic catalyst for the curing of diepoxides will avoid an undesirable premature thermal crosslinking reaction; instead it initiates the formation of linear, solvent-soluble, film-forming, thermally stable, and essentially uncrosslinked, reactive polymers which can be isolated, characterized, if so desired, and then converted at a later stage to insoluble crosslinked solids by radiation curing. The invention also permits the conversion of a polymer product which is soluble in an organic or aqueous organic solvent to a semi-ester which is soluble in an aqueous alkaline solvent. That conversion is effected using a cyclic anhydride, a reagent commonly used to crosslink and insolubilize epoxy-derived polymers, as described in U.S. Pat. No. 2,890,210.

The radiation-sensitive condensation polymers of this invention, and the semi-ester derivatives thereof, have low oxygen sensitivity, which makes it possible to provide high image quality without the need for overcoats or cover sheets. Typically and preferably, the polymers are made by reacting a radiation-sensitive dicarboxylic acid like 1,4-phenylene diacrylic acid with a diepoxide, preferably the diglycidyl ether of a dihydroxybenzene such as resorcinol, or of a bisphenol like Bisphenol A.

Suitable starting materials for preparing the new class of polymers and the radiation-sensitive coating compositions containing said polymers, are described in greater detail below.

Acids: Among the α,β-unsaturated carboxylic acids which may be employed are those conveying radiation crosslinkability, e.g., 1,4-, 1,3- and 1,2-phenylenediacrylic acid, preferably the 1,4-acid; furyl-, pyridyl-, and thienyldiacrylic acids; 2-carboxy-, 3-carboxy- and 4-carboxycinnamic acids; also 2-hydroxy-, 3-hydroxy- and -4-hydroxycinnamic acids. Optionally, nonradiation-sensitive dicarboxylic or phenolic-carboxylic acids like succinic, terephthalic, and hydroxybenzoic acids can be used to replace some of the radiation-sensitive acids in order to convey certain desirable mechanical and physical properties, e.g., adhesion and solubility.

Diepoxides: Compounds of this class which are most useful in the invention include the diglycidyl ethers derived from dihydric phenols like hydroquinone, catechol, resorcinol (which is preferred), dihydroxybiphenyls, dihydroxynaphthalenes, bisphenols, including Bisphenol A, a preferred compound, and, for improved flame resistance, its tetrachloro- and tetrabromo-derivatives. Diglycidyl ethers derived from aliphatic and alicyclic diols, although less preferred, are especially useful as optional reagents to modify such properties as flexibility and softening temperature. Examples of these diols include simple ones like 1,6-hexanediol and 1,4-bis(hydroxymethyl)cyclohexane, and more complex ones like 1,3-bis(3-hydroxypropyl)tetramethyldisiloxane and 2,5-bis(hydroxymethyl)tetrahydrofuran. Other useful diepoxides include the glycidyl esters of aliphatic diacids, and of polyethylene glycols.

In addition to the diglycidyl ethers, other diepoxides may be used as disclosed, for example, in U.S. Pat. Nos. 2,750,395, 2,890,194, and 3,173,971. Both these and the aforementioned diglycidyl ethers may be used, singly or in combination, in accord with the particularly desired properties sought for the polymers. Most of these compounds are available commercially as raw materials for epoxy-type resins or adhesives. Some more common examples of these are the Epons ® from Shell Chemical Co.; the DER ® epoxy resins from the Dow Chemical Co.; certain Bakelite ® and Unox ® resins from Union Carbide Plastics Division and Araldites ® from Ciba-Geigy; also certain Epi-Rez ® resins from Jones-Dabney (Celanese Corp.) and the Epotuf ® resins from the Reichhold Chemicals, Inc. In general, the lower molecular weight ones are preferred for the synthesis of more photoactive polyesters.

Basic catalysts: In the reaction between the preferred dicarboxylic acid and the diepoxide, basic catalysts are used, as pointed out above. These include tertiary amines, e.g., benzyldimethylamine, which is preferred, metal carboxylates, e.g., lithium acetate, quaternary ammonium hydroxides and halides, and alkali metal hydroxides and alkoxides.

Polymerization solvents: Solvents useful for the polymerization reaction include mainly the aprotic polar solvents such as N-methyl-2-pyrrolidone, dimethyl acetamide, sulfolane and the like, which do not have reactive hydroxyl, amino, or other reactive groups. Also, to avoid other unwanted side reactions, it is essential to use an anhydrous solvent which is free of reactive impurities. Some polymerizations can be done in the absence of a solvent, for example, by melt polymerization.

Anhydrides: Cyclic anhydrides used to convert the hydroxyl groups to the semi-ester include saturated and unsaturated aliphatic ones like the preferred succinic anhydride, octadecyl succinic anhydride, cis-4-cyclohexene-1,2-dicarboxylic anhydride, camphoric anhydride, and maleic anhydride; aromatic anhydrides such as phthalic anhydride; and substituted anhydrides such as 4-methyl-, 3-nitro-, and tetrabromophthalic anhydride; also naphthalic anhydride. Mixed anhydrides like o-sulfobenzoic anhydride are also useful. The amount of anhydride used will be depend on the desired degree of conversion to the semi-ester which in turn will depend on the properties desired such as adhesion to the substrate, solubility in aqueous alkali, and dyeability.

Photosensitizers: While the new class of radiation-sensitive polymers of this invention is capable of giving useful resist images their photosensitivity may be improved, and correspondingly, the required exposure decreased by incorporating a suitable sensitizer into the coating composition. A suitable sensitizer is one which assists the photocrosslinking. An example of a suitable sensitizer is 2-benzoylmethylene-1-methylnaphtho[1,2-d]-thiazoline. Other useful ones are disclosed in U.S. Pat. No. 3,929,489. The selection of sensitizer is best determined by matching it to the spectral output of the light source or vice versa.

Plasticizers: Plasticizers which are useful in the coating compositions of the invention include β-methoxyethylacetate (methyl Cellosolve ® acetate), a preferred compound, dibutylphthalate, and N-ethyl-toluenesulfonamide. The choice of plasticizer should be made on the basis of compatibility with the coating composition, and the desired properties of that composition.

Colorants: Fillers, pigments, and dyes (including precursor dyes) can be included not only to give a colored or visible image after exposure, or after exposure and processing, but also to improve physical strength. The amount used will depend on the desired effect. Some useful pigments are the phthalocyanines like the Monastral ® Blue pigments and particularly Monastral ® Blue GF. Other useful colorants are anthraquinone dyes like Sevron ® Blue 2G; triarylmethane dyes like Victoria Blue B Base; thiazine dyes like methylene blue A ex. conc.; complex dyes like Solvent Red Dye No. 109, a complex of the azo dye C.I. Acid Yellow No. 99 and C.I. Basic Violet No. 10. Photochromic dyes such as the spirobenzopyrans and leuco dyes, activator combinations such as tris(N,N-diethylaminophenyl)methane, and a halogenated activator like carbon tetrabromide can be used.

Coating solvents: Coating compositions containing the photocrosslinkable polymers of this invention can be prepared by dispersing or dissolving the resin in any suitable solvent or combination of solvents used in the art of preparing polymer dopes. The solvent must be compatible with the substrate to be employed. While the choice of solvent will vary with the exact polymer and the coating facilities, preferred solvents include 2-ethoxyethanol, 2-(2'-butoxyethoxy)ethanol, N-methylpyrrolidone, and especially aqueous ammonia with the semi-ester polymers. Other solvents include 2-methoxyethanol, dioxane, tetrahydrofuran, dimethylformamide and dimethylacetamide. Optimum concentrations of the crosslinkable resins in the coating solutions are dependent upon the specific resin, the support, and the coating method used. Particularly useful coatings are obtained when the coating composition contains about 1%–50% by weight, and preferably about 2%–20% by weight, of crosslinkable polymer. Higher concentrations are also useful.

Supports: Suitable supports for the coating compositions of the invention are metals such as zinc, copper, aluminum, and magnesium; glass; polymeric films, e.g., regenerated cellulose, cellulose acetate, poly(ethyleneterephthalate), vinyl polymers and copolymers such as polyalkyl acrylates, polyethylene, etc.; laminated printing circuit boards, cardboard, cloth, parchment, polyethylene and polypropylene coated paper, and polyamides like nylon. Supports especially useful to make printing plates, particularly for lithographic printing, include supports made of anodized aluminum, grained aluminum, copper and zinc. The support can be pretreated, e.g., precoated before applying radiation-sensitive coating, with known subbing layers such as gelatin, polyacrylamide, and copolymers of vinylidene chloride and acrylic monomers. The support can also have a filter or anti-halation layer to eliminate unwanted reflection from the support.

The coating composition can be applied to the support by any standard coating technique, e.g., knife coating, spray coating, extrusion coating, spin coating. The dry coating should be from about 0.05 to 10 microns or greater in thickness. Thickness of about 0.1 to 5 microns are useful for lithographic printing plates. In general, the preferred coating thickness will depend on various factors, such as the particular use of the film, and the properties of the polymer used to make the film.

Any conventional method of exposure can be used such as exposing imagewise through a transparency or template to a source of actinic radiation, preferably one which is rich in ultra-violet radiation. Suitable sources include carbon arc lamps, mercury vapor lamps, fluorescent lamps, lasers and the like. The exposure time will vary depending on intensity and spectral energy distribution of the source, its distance from the coating, the nature and thickness of the coating and the degree of crosslinking desired.

The exposed radiation-sensitive elements can be developed by soaking, spraying, swabbing or similarly treating the elements with a developer solution to swell or dissolve and remove only the unexposed areas. Useful developers include the coating solvents described above, e.g., completely organic solvents like 2-ethoxyethanol and 2-(2'-ethoxyethoxy)ethanol; aqueous organic solutions, e.g., 10 volumes of 2-butoxyethanol and 1 volume water or 3 volumes of 2-(2'-n-butoxyethoxy)ethanol and 20 volumes of water, are particularly useful, as are totally aqueous alkaline solutions, especially for the carboxylic acid-containing polyesters, the semiester derivatives. Alkaline developers from about pH 8 to 14 are useful. The alkalinity can be controlled by adding water-soluble inorganic compounds such as the alkali metal silicates, bicarbonates, carbonates, and hydroxides. Alkaline soaps are particularly useful as developers to eliminate scum during processing of lithographic printing plates. Soluble organic bases such as triethanolamine are also useful, alone or in combination. The developers may also contain optional additives to give certain effects, e.g., dyes to stain the image or background areas. Surfactants, wetting agents, and hardeners can also be added. Useful wetting agents include simple polyhydric alcohols such as glycerol and diethylene glycol; esters of inorganic acids such as the phosphate esters of aliphatic alcohols and alkoxy alcohols; commercially available wetting agents like "Zonyl ® A," "Triton ® X-100," and Tergitol ® 15-55.

The invention is illustrated by the following examples.

EXAMPLE 1

To 0.10 g of benzyldimethylamine in a flask fitted with a nitrogen inlet set above the reaction surface, a reflux condenser plus drying tube, and a magnetic stirrer, were added in succession, 20 ml of dry, N-methyl-2-pyrrolidone, 4.36 g (0.02 mol) of 1,4-phenylenediacrylic acid, and 4.44 g (0.02 mol) of resorcinol diglycidyl ether. The flask was purged with dry nitrogen, and then heated for twenty hours at 110° C. The white reaction slurry dissolved after about an hour, to form a colored solution. This was cooled to room temperature at the end of the heating period; the resulting viscous solution was precipitated as a fibrous solid by gradual addition to 0.5% sodium hydroxide solution. This was pulverized in a high speed mixer-blender, filtered, mixed with 250 ml distilled water and reworked three times until neutral. The polymer can be isolated satisfactorily by precipitation in water instead of alkali.

The resulting condensation polymer was obtained in 92% yield after air drying followed by drying over phosphorous pentoxide. Dissolved at 0.5% weight/volume in dimethylformamide, the polymer exhibited an inherent viscosity of 0.23 in a Cannon-Fenske Series 75 viscometer at 30° C. This polymer was useful as a photoresist, as demonstrated in the next Example.

EXAMPLE 2

A filtered coating solution of the following composition:

| | |
|---|---|
| Polymer of Example 1 | 0.10 g |
| 2-Benzoylmethylene-1-methylnaptho-[1,2-d]-thiazoline | 0.009 g |
| Solvent Red Dye 109 | 0.009 g |
| 2-Methoxyethanol | 1.7 ml | was applied to a 3 mil (76 microns) thick polyethylene terephthalate film using a doctor knife with a 2 mil (50 micron) slot. The air-dried coating was exposed through a 2 to 98% halftone 150 line dot target for three minutes to the radiation of a Sylvania F15T8-BLB light source at an intensity of about 1 mwatt/cm$^2$. The exposed film was soaked for 10 seconds in an aqueous solution containing 7.4% by weight of 2-(2-n-butoxyethoxy)ethanol (butyl Carbitol ®), rubbed with a cotton swab, and rinsed in water to remove the unexposed areas, leaving hardened polymer on the film in the exposed areas.

EXAMPLE 3

The polymerization procedure of Example 1 was repeated through the 20-hour/110° C. heating period, then 2.0 g (0.02 mol) of succinic anhydride was added, and the mixture was maintained at 105°–110° C. for two hours.

The resulting succinylated polymer was precipitated by adding the solution at room temperature to 200 ml distilled water with stirring. The filtered solid polymer was washed and dried as in Example 1 to give 10.5 g (96%) yield of a cream colored solid, soluble in 2-methoxyethanol, tetrahydrofuran, dimethylsulfoxide, dimethylformamide, and N-methyl-2-pyrrolidone. It formed a firm, clear, hard film with good adhesion to glass. The polymer dissolves in 1% sodium hydroxide and is precipitated therefrom with hydrochloric acid.

Succinylated polymers prepared following this general procedure include the following:

| Diepoxide Employed | Theoretical % Succinylation |
|---|---|
| A Resorcinol diglycidyl ether | 10 |
| B Resorcinol diglycidyl ether | 25 |
| C Resorcinol diglycidyl ether | 50 |
| D Bisphenol A diglycidyl ether | 25 |
| E Bisphenol A diglycidyl ether | 50 |

Resorcinol diglycidyl ether, distilled at 128°–131° C./0.10 mm., is available as Heloxy ® 69 from The Wilmington Chemical Corp. of Wilmington, Del. Bisphenol A diglycidyl ether is available as Epon ® 825 from The Plastics and Resin Division of The Shell Chemical Co. and as "DER ® 332" from the Dow Chemical Company.

Other typical hydroxy and carboxylic acid substituted polymers made by procedures similar to Examples 1 and 3 are listed in Table 1. Inherent viscosities, IV, were measured as described in Example 1. Glass transition temperatures, Tg, °C., were measured on a differential scanning calorimeter, the Du Pont 990 DSC model. This series mainly shows the effect of catalyst and degree of succinylation on polymer properties.

TABLE 1

| mM. PDAA | mM. RDGE | mM. BPA | An. | Catalyst | Solvent | IV | Tg °C. |
|---|---|---|---|---|---|---|---|
| 20 | 20 | — | — | BDMA | A | 0.23 | — |
| 20 | — | 20 | SA (20 mM) | BDMA | A | 0.33 | 80 |
| 20 | — | 20 | SA (10 mM) | BDMA | A | 0.24 | 75 |
| 10 | 10 | — | — | BPA | A | 0.24 | 70 |
| 10 | 10 | — | — | Pyridine | A | 0.14 | — |
| 5 | 5 | — | — | Dabco | A | 0.26 | — |
| 5 | — | 5 | — | K++ salt PDAA | B | 0.24 | 76 |
| 5 | — | 5 | — | BDMA | B | 0.26 | — |
| 5 | — | 5 | — | BDMA | A | 0.24 | 87 |
| 10 | 10 | — | — | N, NT | A | 0.19 | — |

Solvents:
A = N-methyl-2-pyrrolidone
B = N,N-dimethylacetamide
Reactants:
PDAA = 1,4-phenylene diacrylic acid
RDGE = Resorcinol diglycidyl ether
BPA = Bisphenol A diglycidyl ether
An = Anhydride
BDMA = Benzyldimethylamine
SA = Succinic anhydride
BTA = Benzytrimethylammonium hydroxide
Dabco = 1,4-diazabicyclo[2.2.2]octane
N,N,T = N,N'-tetramethylethylene diamine

EXAMPLE 4

Coating solutions of polymers B, C, and E of Example 3, analogous to the solution of Example 2, were made up and coated, dried, exposed, and developed as in Example 2 but employing the following developers:
3B 0.6% aqueous sodium silicate (by weight)
3C 0.5% aqueous sodium silicate
3E Water solution of 7.4% 2-(2'-butoxyethoxy)ethanol and 0.3% NaOH
Results were similar to those of Example 2.

EXAMPLE 5

A filtered coating solution made from:

| | |
|---|---|
| Triethylene glycol diacetate | 0.04 g |
| 2-Benzoylmethylene-1-methyl-napth[1,2-d]thiazoline | 0.032 g |
| Polymer 3C | 0.80 g |
| 2-Methoxyethanol | 8.0 ml |
| Solvent Red Dye 109 | 0.04 g | was whirl coated on aluminum plates and dried as described for Example 9 to give a dry film coating weight of 25.8 mg/dcm². The coated plate was exposed three minutes through a photograhic transparency to radiation from a 2 Kw pulsed xenon nuArc ® source, soaked 20–30 secs in 0.5% sodium silicate solution, rubbed with a cotton swab to remove only the unexposed areas, and rinsed.

A similar plate made with Polymer 3E gave similar results when developed in a solution made from 1 part by weight of a 35% sodium silicate solution, 60 parts water and 50 parts 2-methoxyphenol.

EXAMPLE 6

To demonstrate polymerization/phthalylation, a phthalylated analog of one of the products of Example 3 was prepared in a manner identical to that employed there, except that phthalic anhydride was employed at twice the molar proportion of the other ingredients, instead of using equimolar proportions of succinic anhydride. To use this polymer (polymer 6) as a photoresist, a solution of the composition:

| | |
|---|---|
| Polymer 6 | 0.10 g |
| Solvent Red Dye 109 | 0.02 g |
| 2-Methoxyethanol | 2 mil | was coated on a glass slide to a dry thickness of 0.3 mils (~7.6 microns). The air-dried film was exposed through a transparency for four minutes to the radiation source of Example 2. Development in tetrahydrofuran for thirty seconds resulted in removal of the unexposed areas, leaving a hardened red image in the exposed areas on the slide.

EXAMPLE 7

To illustrate mixed-acid polymerization/succinylation:

In an apparatus analogous to that of Example 3 a mixture of:

| | |
|---|---|
| dry benzyldimethylamine | 0.05 g |
| dry N-methyl-2-pyrrolidone | 5 ml |
| 1,4-phenylenediacrylic acid | 0.872 g (4 mM) |
| Terephthalic acid | 0.116 g (1 mM) |
| Resorcinol diglycidylether | 1.110 g (5 mM) | was heated under nitrogen at 120° C. for 23 hours. The resulting orange solution was cooled to 105° C. and 0.50 g of succinic anhydride was added. The solution was kept at 105° C. for two hours, cooled to room temperature, and slowly added with stirring to 400 ml distilled water to precipitate the polymer. After several water washings, the wet polymer (polymer 7) was pulverized in a blender, filtered, air-dried, and then dried under vacuum at 56° C. In order to prepare a resist, a solution of:

| | |
|---|---|
| Polymer 7 | 0.1 g |
| Solvent Red Dye 109 | 0.02 g |
| 2-Methoxyethanol | 2.0 ml | was coated on a glass slide to a dry thickness of 0.3 mil (7.6 microns). The air-dried film was exposed for four minutes through a transparency to radiation from the source of Example 2. Development for thirty seconds with tetrahydrofuran removed unexposed areas, leaving a hardened red image in the exposed areas.

EXAMPLE 8

The polymerization/succinylation used in the preparation of Example 3E was repeated at the 10 millimol level, substituting cyclohexane-1,4-dimethanol diglycidyl ether for bisphenol A diglycidyl ether, and heating for twenty-two hours at 110° C. during the polymerization. The diglycidyl ether, distilled at 130°–131° C./0.25 mm, is available as Heloxy ® MK107 from the Wilmington Chemical Corp. of Wilmington, Del. The product was a creamcolored polymer (polymer 8). To demonstrate its use, a coating solution of:

| | |
|---|---|
| Polymer 8 | 0.3 g |
| 2-methoxyethanol | 2 ml |
| ammonium hydroxide (38%) | 0.25 ml | was coated on a glass slide to give a dry film 0.15 mil (3.8 microns) thick. The coated slide was heated five minutes at 60° C., cooled to room temperature, and exposed for six minutes through a transparency to radiation from the source described in Example 2. Development with aqueous 0.4% sodium silicate solution removed unexposed areas, leaving hardened polymer on the plate in the exposed areas.

EXAMPLE 9

Two well dispersed pigmented mixtures, A and B of Table II, were whirl coated on silicate-treated anodized aluminum plates and post-dried at 130° C. to give dry film coating weights of 25 mg/dcm$^2$ and 26 mg/dcm$^2$, respectively.

TABLE II

| Composition | A | B |
|---|---|---|
| Polymer 3C | 1.60 g | 1.40 g |
| Carboset ® 525* | — | 0.20 g |
| 2-Benzoylmethylene-1-methyl naphth[1,2-d]thiazoline | 0.064 g | 0.064 g |
| 2-Ethoxyethyl acetate | 0.048 g | 0.048 g |
| Monastral ® Blue GF (BT-417D)** | 0.15 g | 0.12 g |
| 2-Methoxyethanol | 16.0 ml | 22.0 ml |
| Tetrahydrofuran | 15.0 ml | — |
| Ammoniacal zinc acetate solution | 0.40 ml | 0.040 ml | made from 0.50 g zinc acetate dihydrate, 1.5 ml 38% ammonium hydroxide and 50 ml 2-methoxyethanol.
*Carboset ® 525 is an acrylic thermoplastic resin of MW 260,000 and acid number 76–85 from the B. F. Goodrich Chemical Co., Cleveland Ohio.
**Monastral ® Blue GF is a blue phthalocyanine pigment from E. I. du Pont de Nemours and Company, Inc., Wilmington, DE.

The plates were exposed three minutes through a standard halftone and line resolution test target to the light source of Example 5, swabbed with soaped cotton pads (Ivory soap) to remove only the unexposed areas, and water rinsed. Plates A and B were mounted side by side on a conventional offset lithographic press and after making 300,000 copies both plates showed good printing of 150 line 2% to 98% halftone dots and of the line resolution target. Plate B gave higher density prints than A.

EXAMPLE 10

A negative working lithographic film was prepared and tested as described by steps A, B, C, and D below.

A. Coating the Photosensitive Layer

A filtered coating solution of the composition:

| | |
|---|---|
| Triethyleneglycol diacetate | 0.01 g |
| Polymer 3E | 0.80 g |
| 2-Benzoylmethylene-1-methyl-naphth[1,2-d]thiazoline | 0.032 g |
| 2-Methoxyethanol | 7 ml |
| Ammoniacal zinc acetate solution of Example 9 | 1.0 ml | was coated on a 1 mil (25 micron) polyethylene terephthalate film, yielding a 0.1–0.2 mil (2.5–5.0 micron) thick clear dry coating.

B. Coating the Nonphotosensitive Black Layer

A coating dispersion consisting of 10% by weight of a predispersed solid mixture of 55% Carboset ® 525 and 45% carbon black and 90% dispersing fluid made from 92% methylene chloride and 8% 2-methoxyethanol was extrusion-coated to a dry thickness of 0.08 mil (2 micron) on resin-subbed 4 mil (100 micron) polyethylene terephthalate photographic film base of the type described in Alles et al., U.S. Pat. No. 2,627,088.

C. Laminating Photosensitive Layer to Black Layer

Films A and B were contacted, photosensitive surface to black surface, and passed between moving rolls set at 45 psi, the lower roll heated to ~120° C. After cooling the film to room temperature, the 1 mil polyethylene terephthalate could be peeled off, leaving the photosensitive layer attached to the carbon-containing layer.

D. Exposure and Development

The element was exposed and processed as in Example 9, except that the developer was a 6% aqueous solution of 9 parts sodium carbonate and 1 part sodium bicarbonate. The film as thus prepared and processed, copied 2%–98% 150 line halftone dots as high density black images.

EXAMPLE 11

Using the procedure of Example 1 a polyether-ester polymer was made from 0.82 g, 5 mM, recrystallized cis/trans p-hydroxycinnamic acid, 1.70 g, 5 mM pure bisphenol A diglycidyl ether (Epon ® 825), 0.02 g benzyldimethylamine and 5 ml pure cyclohexanone. The polymer was precipitated in petroleum ether and reprecipitated to give 1.0 g white powder with an inherent viscosity of 0.21 in dimethylformamide.

A similar polymer made with resorcinol diglycidyl ether formed a clear hard film, soluble in 2-methoxyethanol, which insolubilized when exposed as described for Example 2.

Melt polymerization was used to make a similar polymer by heating a nitrogen-blanketed, stirred mixture of 0.06 g benzyldimethylamine, 0.836 g 98% pure cis-p-hydroxycinnamic acid, and 1.11 g resorcinol diglycidyl ether at 72°–75° C. for eight hours. The dry polymer had an inherent viscosity of 0.23 in dimethyl formamide.

EXAMPLE 12

To prepare a composition useful for making a negative working lithographic film, a filtered solution of 0.040 g of the sensitizer of Example 2 in 2 ml methylene chloride was added to a high-speed stirred solution made from:

| | |
|---|---|
| distilled water | 5.0 ml |
| 38% ammonium hydroxide | 0.3 ml |
| Polymer 3C | 1.0 g |
| 1% Triton ® X100 in water | 1.0 ml |
| 5% gelatin in water | 4.0 g |
| Ethanol | 0.6 ml |

Triton ® X-100 is a Rohm and Haas nonionic surfactant, octylphenoxypolyethoxyethanol. A water solution of a fluorocarbon surfactant, viz, 0.5 ml of 0.2% FC-128 from the Minnesota Mining and Manufacturing Co., was added to the coating solution, and the latter was knife coated on the nonphotosensitive black layer B of Example 10. The air-dried film was heated in an oven at 130° C. for two minutes to form a 0.1 mil (2.5μ) dry topcoat. The film was exposed for one minute as described for Example 2, soaked for 10 seconds in a 1% aqueous solution of 9 parts sodium carbonate and 1 part sodium bicarbonate, water-rinsed, and rubbed with a wet cotton swab to remove only the unexposed areas. The exposed areas remained as high density black images.

EXAMPLE 13

A 0.15 mil (2.5 micron) thick dry photoresist was prepared by whirl coating a filtered solution of:

| | |
|---|---|
| triethylene glycol diacetate | 0.024 g |
| sensitizer of Example 2 | 0.032 g |
| Polymer 3C | 0.80 g |
| 2-Methoxyethanol | 12.0 ml | on a 1 ml (25 micron) thick copper-clad epoxy board. The film was exposed as described for Example 2 and processed in 31.5% ferric chloride solution to remove the unexposed film and all of the underlying copper. Copper beneath the exposed areas remained firmly attached to the board. The plate, when rinsed and dried, was useful as a printed circuit.

I claim:

1. A process of preparing a lithographic printing plate which comprises coating a polyester or polyesterether, as hereinafter defined, or a dicarboxylic semi-ester thereof, onto an aluminum or other metal support, drying the coating, imagewise exposing the coating to actinic radiation, whereby the coating is cross-linked in the exposed areas, and then treating the coated support with a developer to selectively remove the unexposed areas, said developer being selected from the group consisting of an organic solvent, an aqueous organic solvent, and an aqueous alkaline solvent;

said polyester or polyesterether being selected from a class of condensation polymers composed of radiation-sensitive, film-forming, linear polyesters and polyesterethers having within the polymeric backbone a multiplicity of repeating units of the formula:

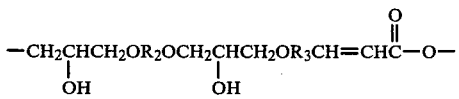

wherein $R_2$ is a divalent aryl, alkyl, aralkyl, or cycloalkyl radical having two to twenty carbon atoms, which radical may be substituted with a $C_1$ to $C_{10}$ alkyl or cycloalkyl, aryl, or halogen group; and wherein $R_3$ is a divalent aryl, aroyl, arylacryloyl, furylacryloyl, pyridylacryloyl, or thienylacryloyl group in which the aromatic unit for aryl is phenyl, biphenyl, or naphthyl and wherein one of the $R_3$ cyclic carbon atoms is directly attached to the β-carbon of the α,β-ethylenic ester group of the repeating unit, and wherein the aromatic unit of the $R_3$ group can be substituted with a $C_1$ to $C_8$ alkyl or cycloalkyl, aryl, aralkyl, or halogen group.

2. The process of claim 1 wherein a dicarboxylic acid semiester of said polyester or polyesterether is coated onto said support from an aqueous ammoniacal solution.

3. The process of claim 2 wherein the aqueous ammoniacal solution contains an ammoniacal zinc-acetate solution, a sensitizer, a pigment, and a plasticizer.

4. The process of claim 2 or 3 wherein the coated support, after being dried and imagewise exposed to actinic radiation, whereby the coating is crosslinked in the exposed areas, is developed by treating with an aqueous alkaline solvent to selectively remove the unexposed areas.

* * * * *